(12) United States Patent
Collados Asensio et al.

(10) Patent No.: US 8,872,596 B2
(45) Date of Patent: Oct. 28, 2014

(54) POLAR SIGNAL GENERATOR

(75) Inventors: Manel Collados Asensio, Eindhoven (NL); Nenad Pavlovic, Eindhoven (NL); Vojkan Vidojkovic, Eindhoven (NL); Paulus T. M. Van Zeijl, Veldhoven (NL)

(73) Assignee: NXP, B.V., Eindhoven (NL)

( * ) Notice: Subject to any disclaimer, the term of this patent is extended or adjusted under 35 U.S.C. 154(b) by 1279 days.

(21) Appl. No.: 12/304,310

(22) PCT Filed: Jun. 6, 2007

(86) PCT No.: PCT/IB2007/052127
§ 371 (c)(1), (2), (4) Date: Dec. 11, 2008

(87) PCT Pub. No.: WO2007/144806
PCT Pub. Date: Dec. 21, 2007

(65) Prior Publication Data
US 2009/0206940 A1    Aug. 20, 2009

(30) Foreign Application Priority Data

Jun. 12, 2006    (EP) ..................................... 06115266

(51) Int. Cl.
*H03C 3/38*    (2006.01)
*H03C 5/00*    (2006.01)
*H03C 3/40*    (2006.01)

(52) U.S. Cl.
CPC ... *H03C 3/40* (2013.01); *H03C 5/00* (2013.01)
USPC ............ 332/145; 332/152; 375/302; 455/102

(58) Field of Classification Search
USPC ................... 332/145, 152; 375/302; 455/102
See application file for complete search history.

(56) References Cited

U.S. PATENT DOCUMENTS

| | | | |
|---|---|---|---|
| 6,834,084 B2 | 12/2004 | Hietala | |
| 2002/0168019 A1* | 11/2002 | Bengtsson et al. | 375/295 |
| 2004/0212445 A1 | 10/2004 | Haglan | |
| 2005/0018790 A1 | 1/2005 | Liu | |
| 2005/0271161 A1 | 12/2005 | Staszewski et al. | |
| 2008/0101500 A1* | 5/2008 | Voloshin et al. | 375/295 |
| 2009/0323510 A1* | 12/2009 | Furrer et al. | 370/210 |

FOREIGN PATENT DOCUMENTS

| | | |
|---|---|---|
| EP | 1536554 A | 6/2005 |
| WO | 0124356 A1 | 4/2001 |
| WO | 2004017590 A1 | 2/2004 |

* cited by examiner

*Primary Examiner* — Arnold Kinkead

(57) ABSTRACT

The present invention relates to a polar signal generator and method of deriving phase and amplitude components from in-phase (I) and quadrature-phase (Q) components of an input signal, wherein the I and Q components are generated at a first sampling frequency based on the input signal, and are then up-sampled in accordance with a predetermined first interpolation factor (N), to generate up-sampled I and Q components at a second sampling frequency higher than the first sampling frequency. The up-sampled I and Q components are converted into the phase and amplitude components, wherein the converting step is operated at the second sampling frequency. Moreover, the phase and amplitude components can be further up-sampled, optionally by different sampling frequencies, to a third and a fourth sampling frequency. Thereby, I-Q generation and cartesian-to-polar transformation can be performed at lower frequencies, which reduces power consumption.

14 Claims, 5 Drawing Sheets

POLAR SIGNAL GENERATOR

The present invention relates to a method and polar signal generator for deriving phase and amplitude components from in-phase (I) and quadrature-phase (Q) components of an input signal.

In current power amplifier (PA) designs, linearity and power efficiency are key requirements. This problem becomes even more demanding for wireless communication systems having amplitude and phase modulation, e.g., quadrature amplitude modulation (QAM). Especially for wireless communication systems using orthogonal frequency division multiplex (OFDM) as modulation scheme, the above problem gets even worse due to the fact that OFDM signals possess high peak to average ratios (e.g. 10 dB) which imposes high linear operation requirements on driving schemes for the PAs of these OFDM communication systems. However, such linearity demands lead to significant reductions of efficiency of the PAs.

In order to solve efficiency requirements, polar modulation technology has been developed to facilitate system design. A polar modulator can independently process a carrier's amplitude and phase signals, typically working together with a non-linear power amplifier operating in switched mode. The elimination of the linear operation requirement enables power amplifier efficiency to be maximized for each modulation standard. Under a polar modulation scheme, multimode operation may be achieved by digital switching.

In a conventional polar modulator, a baseband digital processor provides I and Q signals that are up-converted with an IQ mixer to the RF frequency, using a phase locked loop (PLL) circuit and an IQ phase shifting circuit. The up-converted signals are combined, and the combined phase modulated signal is then supplied via a bandpass filter to a phase modulation driver which applies it to an output stage. On the other hand, an envelope modulated signal is generated and supplied to the output stage. At the output stage, the envelope modulated signal is combined with the phase modulated signal to generate an amplified polar modulated signal which is supplied to a transmission antenna. Thus, RF (Radio Frequency) blocks are fed with envelope and phase signals (or a function of the two).

Recently, there has been increased interest in the study of different polar transmitter architectures. Most of these novel implementations strive for a higher efficiency than their Cartesian counterparts. This is because, generally speaking, the polar decomposition of the baseband signal allows for more efficient transmitter implementations. Another important advantage of some polar transmitters (in particular those where the phase modulation is introduced in the phase-locked loop) is their immunity to VCO-pulling. Another benefit of some of these new architectures is that they might prove to be more suitable for implementation in future high-yield, low-cost deep sub-micron CMOS (Complementary Metal Oxide Semiconductor) processes.

However, so far, the question how to generate the envelope and phase signals has received little attention. The generation of these signals might be far from trivial, especially in medium to large bandwidth applications. The problem is that the envelope and phase signals (or any function of the two) tend to present much wider spectra than their I and Q counterparts, requiring much higher sampling rates. In view of this, it has been proposed to generate the envelope and phase signals in the analogue domain, eliminating the high-sampling rate problem. This might be suitable for some applications, but in order to have better accuracy control, a digital implementation might still be preferred.

US-A-2004/0212445A1 discloses polar a modulation apparatus with a digital magnitude filter in a magnitude signal path. The magnitude signal is provided by an I/Q-to-magnitude/phase conversion block and filtered by the digital magnitude filter to control the gain of the PA. In the magnitude signal path, an up-sample circuit is coupled to the digital magnitude filter which is designed or programmed as a function of the up-sampling rate to perform digital interpolation. In operation, the digital magnitude filter may provide significant improvement in signal quality.

It is an object of the present invention to provide a polar signal generator and method, which enable generation of discrete-time envelope and phase signals (or any function of the two) in a power-efficient way.

This object is achieved by a polar signal generator as claimed in claim 1 and by a method of deriving phase and amplitude components, as claimed in claim 11.

Accordingly, although the envelope and phase signals (or any function of the two) require to be generated at very high sampling rates, they can still be derived from lower-sampling rate I-Q components, allowing the I-Q generation and Cartesian-to-polar transformation, which may be implemented using the CORDIC algorithm or any other suitable algorithm, to run at lower frequencies. This has clear power consumption advantages. Moreover, alias overlapping in the phase and amplitude components obtained after conversion can be controlled by the first interpolation means.

As an additional advantage, the phase and amplitude components can be further up-sampled in an individual manner, optionally by different sampling frequencies, to a third and a fourth sampling frequency. The proposed solution is beneficial in those implementations where the envelope and phase signals need to be sampled at the same frequency. In this regard, it is noted that the Cartesian-to-polar transformation may provide the same sampling frequency for both phase and magnitude components.

Additionally, second interpolation means may be provided for up-sampling at least one of the phase and amplitude components in accordance with at least one respective predetermined second interpolation factor to obtain at least one of an up-sampled phase signal and an up-sampled amplitude signal. Thereby, the interpolation factor can be different for the phase and amplitude components.

Furthermore, signal processing means may be provided for processing the at least one of the up-sampled phase signal and the up-sampled amplitude signal, to obtain control signals for a polar transmitter. The signal processing means may be provided for the phase component only, and may comprise a phase-to-frequency converter means.

As an alternative, signal processing means may be provided for directly processing the phase signal, to obtain a processed phase signal without prior second interpolation. Again, the signal processing means may comprises a phase-to-frequency converter means.

In addition, a third interpolation means may be provided for up-sampling the above control signals in accordance with respective predetermined second interpolation factors to individually control the sampling rates of said control signals. This allows to achieve required individual sampling rates for each of the control signals.

In a specific example, the first interpolation means may be embedded in an inverse fast fourier transformation (IFFT) block. In particular, the first interpolation means may be arranged to perform up-sampling by padding zeros and running IFFT at the second sampling frequency. As an IFFT block is often already present in polar transmitter systems, a straight forward and flexible implementation can be achieved.

Further advantageous developments or modifications are defined in the dependent claims.

The present invention will now be described based on preferred embodiments with reference to the accompanying drawings, in which.

The preferred embodiments will now be described in connection with a polar transmitter architecture which makes use of an IQ modulation in a wireless communication system, such as Bluetooth, UWB (Ultra-Wideband), WLAN (Wireless Local Area Network) or GSM EDGE (Global System for Mobile communication Enhanced Data rates for GSM Evolution).

In the following, the power saving principle underlying the preferred embodiments is described starting from the conventional concept of deriving polar components from Cartesian components.

Figure 1:
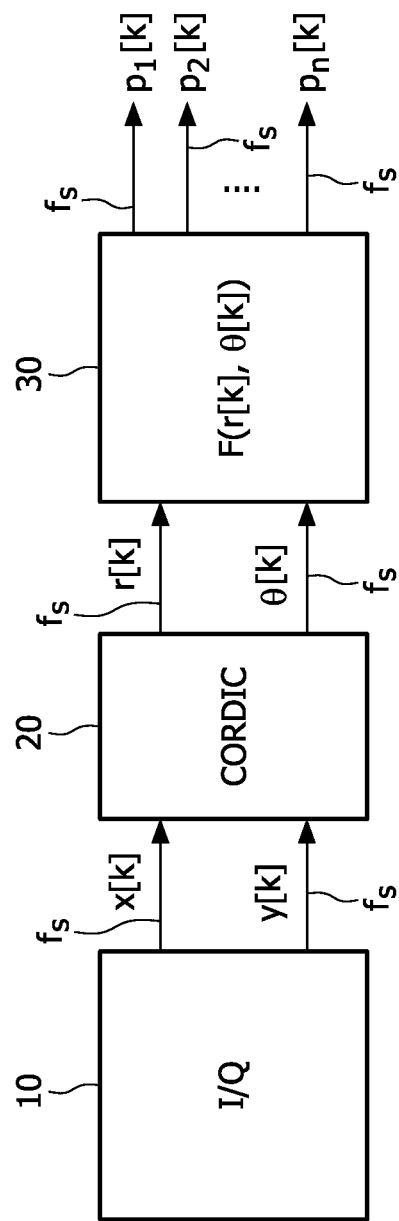
FIG. 1 shows a schematic functional block diagram of a conventional concept of deriving polar signals.

FIG. 1 shows a schematic functional block diagram of conventional signal generation in a generic polar transmitter. An I and Q signal generation block 10 generates the in-phase (I) and quadrature (Q) samples (x[k], and y[k]) according to a predetermined standard being implemented, e.g., IEEE 802.11a/b/g or EDR Bluetooth. The sampling frequency fs of these signals is derived taking into account the minimum sampling frequency required for the phase and envelope signals (r[k], θ[k]) rather than the bandwidth of the quadrature samples themselves. The phase and envelope signals are calculated in a CORDIC (COordinate Rotation DIgital Computer) block 20, which needs to operate at the same high sampling frequency of fs. Subsequently, the phase and envelope signals might be fed to an arbitrary function generator 30 (F(r[k], θ[k])) to produce the polar signals ($p_1[k]$, $p_2[k]$, ... $p_n[k]$), which finally control the polar transmitter. As an example, the arbitrary function generator might be such that, n=2, $p_1[k]=r[k]$, and $p_2[k]=\theta[k+1]-\theta[k]$.

In general, the CORDIC algorithm applied in the CORDIC block 10 is based on a calculation method used to approximate standard transcendental functions. It does not use calculus based methods such as polynomial or rational function approximation.

The implementation shown in FIG. 1 has the drawback that all blocks are forced to operate at a sampling rate fs. However, this is actually not needed. The preferred embodiments are based on the insight that, although the envelope and phase signals (or any function of the two) require to be generated at very high sampling rates, they can still be derived (with careful design) from lower-sampling rate I-Q components, allowing the I-Q generation and Cartesian-to-polar transformation (usually implemented using the CORDIC algorithm) to run at lower frequencies.

The following exemplary implementations according to the first to fourth preferred embodiments are suitable for the IEEE 802.11a/b/g standard.

Figure 2:
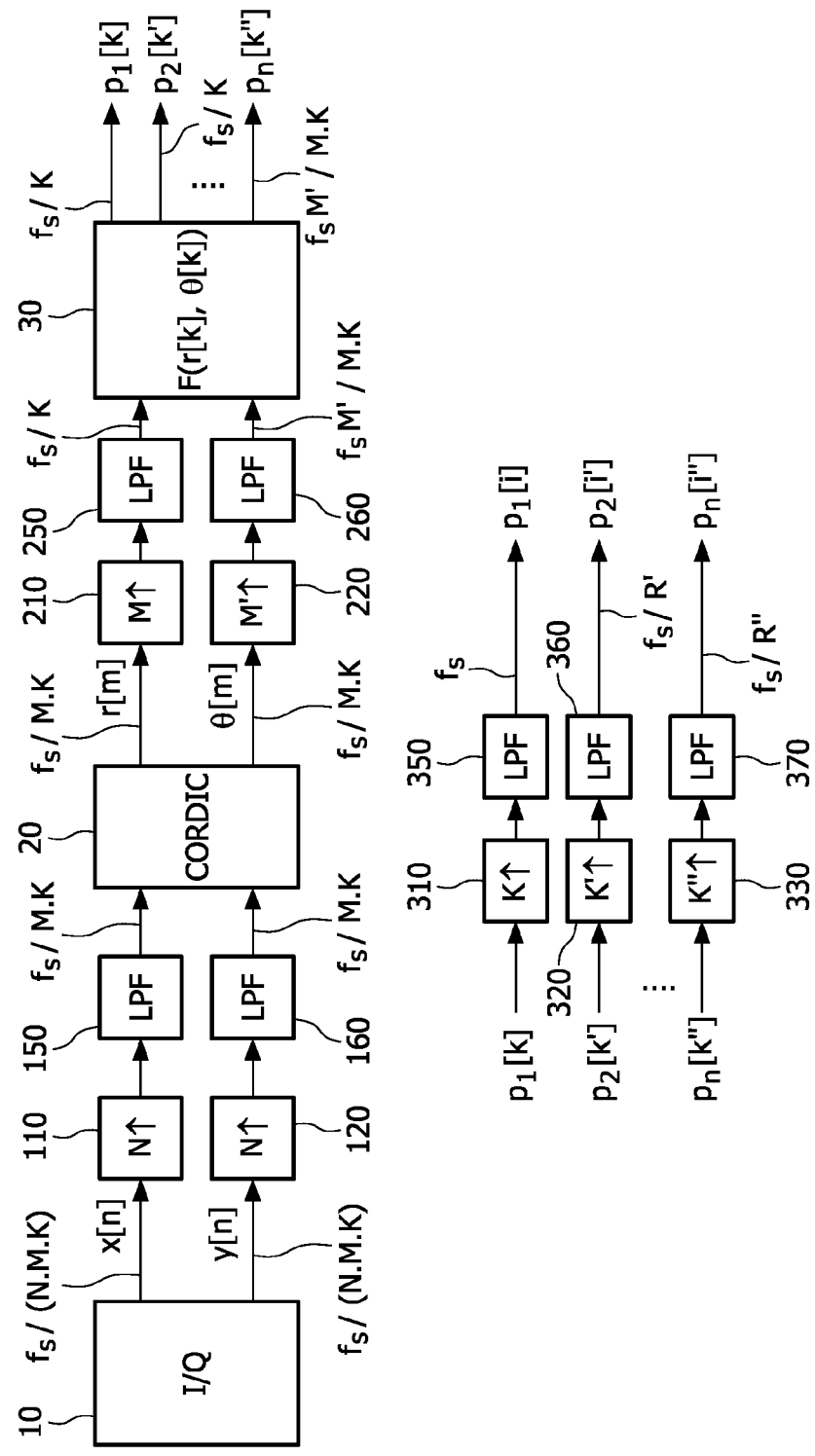
FIG. 2 shows a schematic functional block diagram of a polar baseband generator according to a first preferred embodiment.

FIG. 2 shows a schematic functional block diagram of a polar baseband generator according to a first preferred embodiment. In FIG. 2, a generic part, according to the basic principle of the present invention is shown. In contrast to the architecture of FIG. 1, the I and Q signal generation block 10 now operates at sampling frequency fs/(NMK), which is NMK times smaller than the previously required sampling frequency, wherein N, M, and K are interpolation factors, as explained later. After the I/Q signal generation block 10, the Cartesian components I and Q are up-sampled in respective first interpolating units 110, 120 by a first interpolation factor N, and then filtered using respective low pass filters 150, 160. This allows, in those cases where this is required, to control alias overlapping in the envelope (amplitude) and phase signals $r_i[m]$ and θ[m] obtained after a subsequent CORDIC block 20. It is noted that the CORDIC block 20 operates now at a higher sampling frequency fs/(MK), instead of the still higher conventional sampling frequency fs. After that, second respective interpolation stages 210, 220 and low pass filtering stages 250, 260 are provided before an arbitrary function generator block 30 which implements a function F(r[k], θ[k]) and which outputs polar signals $p_1[k]$, $p_2[k']$, ..., $p_n[k'']$. In the second interpolation stages 210, 220, the interpolation factor can be different for the envelope and phase components. In FIG. 2 this difference is indicated by the use of different second interpolation factors M and M', so that the envelope and phase signals $r_i[m]$ and θ[m] are obtained at respective different sampling frequencies fs/K and fsM'/(MK).

Finally, the polar signals $p_1[k]$, $p_2[k']$, ..., $p_n[k'']$ output from the arbitrary function generator block 30 can be further interpolated by a number of third interpolation units 310, 320, 330, using respective third interpolation factors K, K', and K'', followed by a corresponding number of low pass filtering stages 350, 360, 370, to achieve required or desired sampling frequencies or rates fs, fs/R' and fs/R'' for each of final polar signals ($p_1[i]$, $p_2[i']$, ..., $p_n[i'']$), wherein R' and R'' can be calculated as a function of the first, second and third interpolation factors N, M, M', K, K', and K''.

Figure 3:
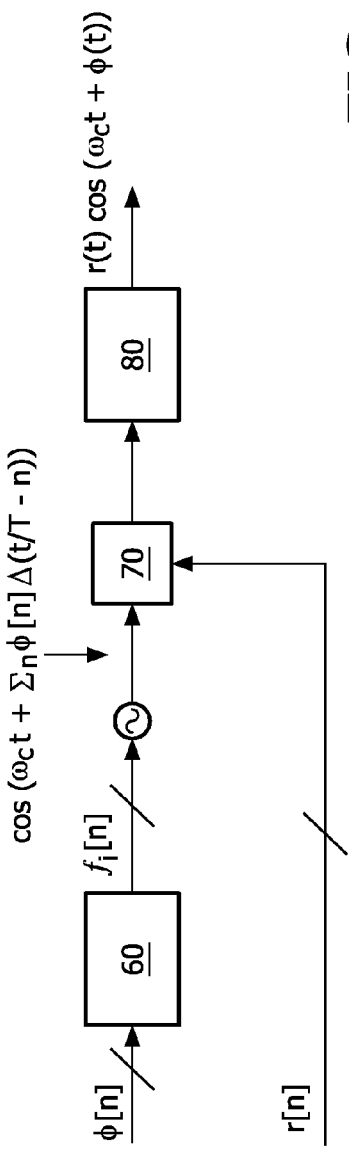
FIG. 3 shows a schematic functional block diagram of a polar transmitter architecture in which the present invention can be implemented.

FIG. 3 shows a schematic functional block diagram of a polar transmitter architecture based on linear reconstruction of a phase and zero-order-hold envelope, in which the preferred embodiments can be implemented for generating or deriving amplitude and phase components.

In the architecture of FIG. 3, instantaneous frequency samples $f_i[n]$ obtained from a phase-to-frequency converter 60 based on input phase samples φ[n] are applied in the same phase-locked loop (PLL) circuit used to synthesize a carried signal, while envelope samples r[n] are applied to an amplitude control device 70, e.g., a power amplifier (PA), in a zero-order-hold fashion, i.e., the input is sampled and held for a specified sample period. This kind of polar transmitter requires a much higher update rate for the envelope, in order to push the stronger aliases coming from the zero-order-hold action far away and ease the filtering. Alias coming from the phase information are less severe because phase samples experience a first-order-hold interpolation thanks to the integration in the PLL loop. The polar-modulated output signal of the amplitude control device 70 is passed through a band pass filtering stage 80 before being transmitted.

Figure 4:
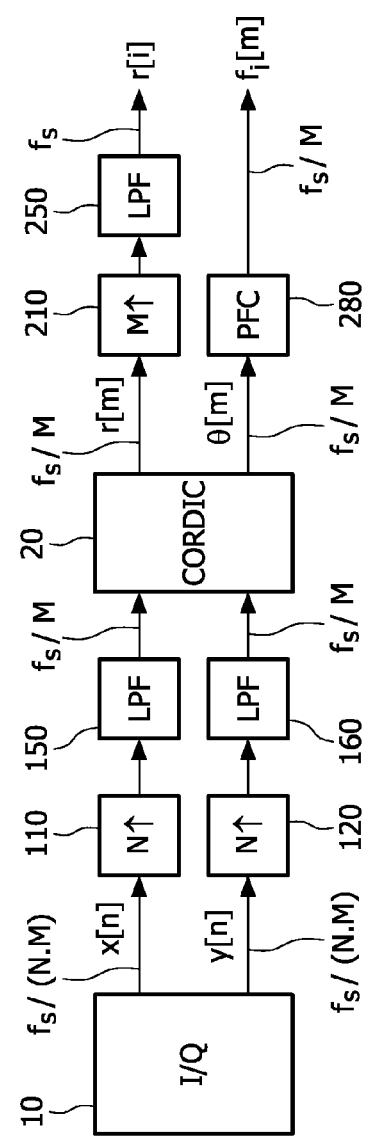
FIG. 4 shows a schematic functional block diagram of a polar baseband generator according to a second preferred embodiment.

FIG. 4 shows a schematic functional block diagram of a polar baseband generator according to a second preferred embodiment. Similar to the first and subsequent preferred embodiments, it can be used, for example, as a polar baseband generator for the polar transmitter of FIG. 3. The block diagram of FIG. 4 is a reduced version of the block diagram of FIG. 2, to keep the description simple and put focus only on modified parts of the architecture. Of course, other blocks of FIG. 2, which are not shown in FIG. 4, may be provided as well. This also applies to the subsequent preferred embodiments.

In the second preferred embodiment, the arbitrary function generator block 30 of FIG. 2 has been replaced by a phase-to-frequency converter block 280 which is provided only in the lower branch and which outputs a modified phase signal (θ[m+1]−θ[m]). Also, it has been assumed that the sampling frequency fs/M after the CORDIC block 20 is sufficiently high for the phase, so that no second interpolation stage is required in the lower branch. In case the sampling frequency at the output of the CORDIC block 20 is not high enough, the right-hand side of the signal generator in FIG. 4 can be replaced by the block diagram of FIG. 5 or FIG. 6, to arrive at the third or fourth preferred embodiment, respectively.

Figure 5:
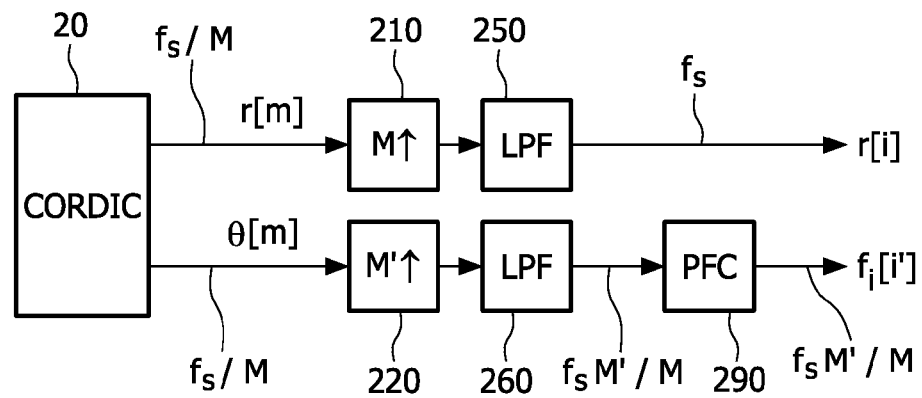
FIG. 5 shows a schematic functional block diagram of a polar baseband generator according to a third preferred embodiment.

FIG. 5 shows a schematic functional block diagram of a modified implementation after the CORDIC block 20 of the polar baseband generator, according to the third preferred embodiment. Contrary to the second preferred embodiment, a phase-to-frequency converter block 290 of the lower branch is now provided after a preceding second interpolation stage 220 and low pass filtering stage 260. Hence, a higher sampling frequency fs M'/M can be provided at the phase-to-frequency converter block 290.

Figure 6:
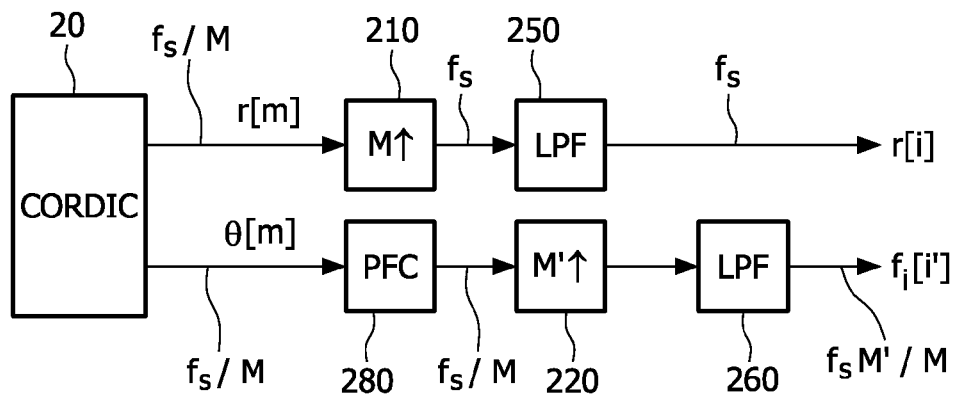
FIG. 6 shows a schematic functional block diagram of a polar baseband generator according to a fourth preferred embodiment.

FIG. 6 shows a schematic functional block diagram of another modification after the CORDIC block 20 polar baseband generator, according to a fourth preferred embodiment. Here, the phase-to-frequency converter block 280 of the lower branch of the third preferred embodiment, which can be operated at the lower sampling frequency fs/M, is provided. However, it is now followed by the second interpolation stage 220 and the low pass filtering stage 260, to thereby obtain the higher sampling frequency fs M'/M at the phase output.

One of the fundamental principles of discrete signals is that "zero padding" in one domain results in an increased sampling rate in the other domain. For example, a common form of zero padding is to append a string of zero-valued samples to the end of some time-domain sequence. This approach can be used in the preferred embodiments to implement the interpolation.

When the I and Q signal generation is based on OFDM, the signal interpolation which takes place before application of the CORDIC algorithm can be embedded in an inverse fast fourier transformation (IFFT) block which block is typically present in OFDM or similar systems. Then, interpolation can be achieved by padding zeros and running the IFFT at higher frequencies. For example in the IEEE 802.11a/g, a 64-IFFT block running at 20 MHz is defined. An interpolated signal (by a factor 2) can be obtained using a 128-IFFT block and a clock frequency of 40 MHz. The 128 samples are obtained by padding 64 zeros to the original 64 samples. The extra zeros are allocated on high frequency subcarriers.

In principle, this zero padding approach could be scaled to obtain any required interpolation factor, as long as the latency of the enlarged-size IFFT block does not pose a problem. Preferably, the up-scaled IFFT block should process the samples as fast as the original-sized IFFT block.

Figure 7:
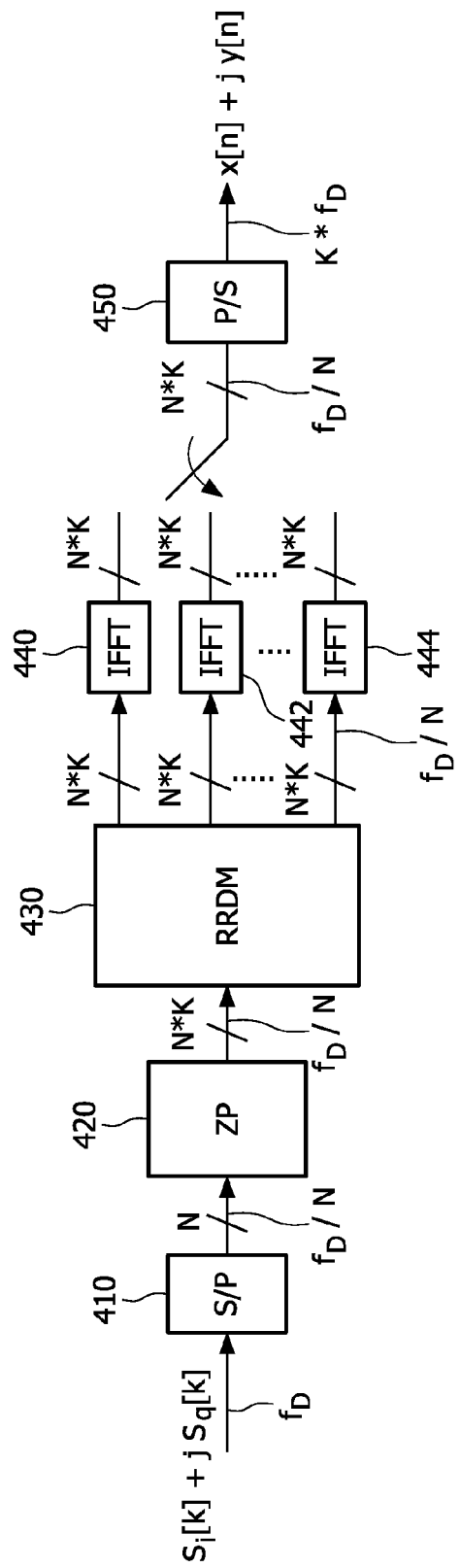
FIG. 7 shows a schematic functional block diagram of an interpolation scheme which can be used in the preferred embodiments.

FIG. 7 shows a schematic functional block diagram of an interpolation scheme which can be used in the preferred embodiments. The constellation symbols (plus some already padded zeros and pilot signals) arrive at a sampling frequency rate $f_D$. Subsequently, they are converted in serial-to-parallel conversion block 410 from serial to parallel transmission state and are then zero-padded in a zero padding block 420. After round-robin de-multiplexing in a corresponding de-multiplexer 430, de-multiplexed groups of N*K symbols are fed in parallel to N*K-size IFFT blocks 440, 442, and 444. These groups of samples are thus distributed in a round robin fashion among the different IIFT blocks 440, 442, and 444. The outputs of the IIFT blocks 440, 442, and 44 are multiplexed, as indicated by the rotating switch in FIG. 7, and converted from parallel to serial in a corresponding parallel-to-serial conversion block 450, thus creating a signal with an over-sampling factor equal to K.

It is noted that the preferred embodiment can be used in any polar transmitter architecture for many wireless standards including but not restricted to IEEE 802.11a/b/g, IEEE 802.16 and IEEE 802.15.

In summary, a polar signal generator and method of deriving phase and amplitude components from in-phase (I) and quadrature-phase (Q) components of an input signal have been described, wherein the I and Q components are generated at a first sampling frequency based the input signal, and are then up-sampled in accordance with a predetermined first interpolation factor, to generate up-sampled I and Q components at a second sampling frequency higher than the first sampling frequency. The up-sampled I and Q components are converted into the phase and amplitude components, wherein the converting step is operated at the second sampling frequency. Moreover, the phase and amplitude components can be further up-sampled, optionally by different sampling frequencies, to a third and a fourth sampling frequency. Thereby, I-Q generation and cartesian-to-polar transformation can be performed at lower frequencies, which reduces power consumption.

The proposed solution according to the above preferred embodiments circumvents the disadvantages encountered with I/Q generation and polar conversion at high sampling frequencies. Additionally, the amplitude and phase components can be processed at different sampling frequencies.

It is noted that the present invention is not restricted to the above preferred embodiments, but can be applied to any polar modulation architecture which is based on a generation of separated amplitude and phase modulation signals from Cartesian I and Q components. Any other number of interpolation units or circuits can be provided, as desired or applicable in possible implementations. Hence, the preferred embodiments may vary within the scope of the attached claims.

Finally but yet importantly, it is noted that the term "comprises" or "comprising" when used in the specification including the claims is intended to specify the presence of stated features, means, steps or components, but does not exclude the presence or addition of one or more other features, means, steps, components or group thereof. Further, the word "a" or "an" preceding an element in a claim does not exclude the presence of a plurality of such elements. Moreover, any reference sign does not limit the scope of the claims.

The invention claimed is:

1. A polar signal generator for deriving phase and amplitude components from in-phase (I) and quadrature-phase (Q) components of an input signal, said apparatus comprising:
    I/Q generating circuitry means for generating said I and Q components based on said input signal, said I/Q generating means operating at a first sampling frequency;

first interpolation means for up-sampling said I and Q components in accordance with a predetermined first interpolation factor, to generate up-sampled I and Q components at a second sampling frequency higher than said first sampling frequency; and conversion means for converting said up-sampled I and Q components into said phase and amplitude components, said conversion means operating at said second sampling frequency.

2. The polar signal generator according to claim 1, further comprising second interpolation means for up-sampling at least one of said phase and amplitude components in accordance with at least one respective predetermined second interpolation factor to obtain at least one of an up-sampled phase signal and an up-sampled amplitude signal.

3. The polar signal generator according to claim 2, further including a signal processing circuit configure to process said at least one of said up-sampled phase signal and said up-sampled amplitude signal, to obtain control signals for a polar transmitter.

4. The polar signal generator according to claim 3, wherein said signal processing circuit comprises a phase-to-frequency converter circuit.

5. A The polar signal generator for deriving phase and amplitude components from in-phase (I) and quadrature-phase (Q) components of an input signal, said apparatus comprising:
   I/Q generating circuitry means for generating said I and Q components based on said input signal, said I/Q generating means operating at a first sampling frequency;
   first interpolation means for up-sampling said I and Q components in accordance with a predetermined first interpolation factor, to generate up-sampled I and Q components at a second sampling frequency higher than said first sampling frequency; and
   conversion means for converting said up-sampled I and Q components into said phase and amplitude components, said conversion means operating at said second sampling frequency;
   second interpolation means for up-sampling at least one of said phase and amplitude components in accordance with at least one respective predetermined second interpolation factor to obtain at least one of an up-sampled phase signal and an up-sampled amplitude signal;
   a signal processing circuit configure to process said at least one of said up-sampled phase signal and said up-sampled amplitude signal, to obtain control signals for a polar transmitter; and
   third interpolation means for up-sampling said control signals in accordance with respective predetermined second interpolation factors to individually control the sampling rates of said control signals.

6. The polar signal generator according to claim 1, further including a signal processing circuit configured to process said phase signal, to obtain a processed phase signal.

7. The polar signal generator according to claim 6, wherein said signal processing circuit includes a phase-to-frequency converter circuit.

8. A polar signal generator for deriving phase and amplitude components from in-phase (I) and quadrature-phase (Q) components of an input signal, said apparatus comprising:
   an I/Q generating circuit configured to generate I and Q components based on said input signal and configured to operate at a first sampling frequency;
   a first interpolation circuit embedded in an inverse fast Fourier transformation (IFFT) block and configured to up-sample-said I and Q components in accordance with a predetermined first interpolation factor to generate up-sampled I and Q components at a second sampling frequency higher than said first sampling frequency; and
   a conversion circuit configured to convert said up-sampled I and Q components into said phase and amplitude components, said conversion means operating at said second sampling frequency.

9. The polar signal generator according to claim 8, wherein said first interpolation circuit is arranged to perform up-sampling by padding zeros and running IFFT at said second sampling frequency.

10. A polar transmitter apparatus comprising a polar signal generator according to claim 1.

11. A method of deriving phase and amplitude components from in-phase (I) and quadrature-phase (Q) components of an input signal, said method comprising the steps of:
   generating said I and Q components based on said input signal, said generating step being operated at a first sampling frequency;
   up-sampling said I and Q components in accordance with a predetermined first interpolation factor, to generate up-sampled I and Q components at a second sampling frequency higher than said first sampling frequency; and
   converting said up-sampled I and Q components into said phase and amplitude components, said converting step being operated at said second sampling frequency.

12. A polar signal generator for deriving phase and amplitude components from in-phase (I) and quadrature-phase (Q) components of an input signal, said apparatus comprising:
   I/Q generating circuitry means for generating said I and Q components based on said input signal, said I/Q generating means operating at a first sampling frequency;
   first interpolation means for up-sampling said I and Q components in accordance with a predetermined first interpolation factor, to generate up-sampled I and Q components at a second sampling frequency higher than said first sampling frequency; and
   conversion means for converting said up-sampled I and Q components into said phase and amplitude components, said conversion means operating at said second sampling frequency;
   second interpolation means for up-sampling at least one of said phase and amplitude components in accordance with at least one respective predetermined second interpolation factor to obtain at least one of an up-sampled phase signal and an up-sampled amplitude signal, the second interpolation means including a first interpolator circuit configured to up-sampling the phase components according to the second interpolation factor, and a second interpolator circuit configured to up-sample the amplitude component at according to a third interpolation factor that is different from the second interpolation factor.

13. A polar signal generator for deriving phase and amplitude components from in-phase (I) and quadrature-phase (Q) components of an input signal, said apparatus comprising:
   I/Q generating circuitry means for generating said I and Q components based on said input signal, said I/Q generating means operating at a first sampling frequency;
   first interpolation means for up-sampling said I and Q components in accordance with a predetermined first interpolation factor, to generate up-sampled I and Q components at a second sampling frequency higher than said first sampling frequency; and conversion means for converting said up-sampled I and Q components into said phase and amplitude components, said conversion means operating at said second sampling frequency;

second interpolation means for up-sampling at least one of said phase and amplitude components in accordance with at least one respective predetermined second interpolation factor to obtain at least one of an up-sampled phase signal and an up-sampled amplitude signal; and a third interpolation means for up-sampling said control signals, the third interpolation means arranged and configured to up-sample each of said control signals according to a respective third interpolation factor.

14. The polar signal generator according to claim 3, wherein the signal processing circuit configure to generate control signals for a polar transmitter as a function of the up-sampled phase signal and said up-sampled amplitude signal.

\* \* \* \* \*